United States Patent
Akaogi

[11] Patent Number: 5,309,400
[45] Date of Patent: May 3, 1994

[54] SENSE CIRCUIT FOR NON-VOLATILE MEMORY DEVICE

[75] Inventor: Takao Akaogi, Inagi, Japan

[73] Assignee: Fujitsu Limited, Kanagawa, Japan

[21] Appl. No.: 111,589

[22] Filed: Aug. 25, 1993

Related U.S. Application Data

[63] Continuation of Ser. No. 654,106, Feb. 12, 1991, abandoned.

[30] Foreign Application Priority Data

Feb. 19, 1990 [JP] Japan .................................. 2-37584

[51] Int. Cl.$^5$ .............................................. G11C 7/00
[52] U.S. Cl. .............................. 365/189.09; 365/204; 307/530
[58] Field of Search ............ 365/189.09, 189.11, 365/189.05, 204, 210; 307/530

[56] References Cited

U.S. PATENT DOCUMENTS

| | | | |
|---|---|---|---|
| 4,494,219 | 1/1985 | Tanaka et al. | 365/189.09 |
| 4,535,259 | 8/1985 | Smarandoiu et al. | 307/530 |
| 4,758,748 | 7/1988 | Takeuchi | 307/530 |
| 4,896,297 | 1/1990 | Miyatake et al. | 365/204 |
| 4,899,070 | 2/1990 | Ou et al. | 307/530 |

FOREIGN PATENT DOCUMENTS 0224125 6/1987 European Pat. Off. .
0326004 8/1989 European Pat. Off. .

OTHER PUBLICATIONS

"A 35-ns 64K EEPROM", Richard D. Jolly et al, 8107 IEEE Journal of Solid-State Circuits, vol. 20, No. 5, Oct. 5, 1985, New York, U.S., pp. 971-978.

"A 1-Mbit CMOS EPROM with Enhanced Verification", Roberto Gastaldi et al, vol. 34, No. 5, Oct. 1988, New York, U.S., pp. 1150-1156.

*Primary Examiner*—John S. Heyman
*Attorney, Agent, or Firm*—Nikaido, Marmelstein, Murray & Oram

[57] ABSTRACT

A sense circuit for a non-volatile memory device includes a selecting circuit for selecting a predetermined cell transistor by selecting a predetermined bit line which is connected to the predetermined cell transistor, a feedback type bias circuit for maintaining a potential of a bus line to a constant level and including a first transistor which flows a current to the bus line, a detecting circuit for detecting whether or not a current flows through the predetermined cell transistor so as to read a data from the predetermined cell transistor and including a terminal for outputting the read data, and a current source including a second transistor for forcibly supplying a predetermined current to the first transistor, so that a gate-source voltage of the first transistor is greater than a threshold voltage of the first transistor.

10 Claims, 3 Drawing Sheets

SENSE CIRCUIT FOR NON-VOLATILE MEMORY DEVICE

This application is a continuation of application Ser. No. 07/654,106 filed Feb. 12, 1991, now abandoned.

FIELD OF THE INVENTION

The present invention generally relates to sense circuits, and more particularly to a sense circuit for reading data from a non-volatile memory device.

BACKGROUND OF THE INVENTION

FIG. 1 shows an essential part of an example of a conventional sense circuit together with related parts of an erasable programmable read only memory (EPROM). A floating gate transistor Q6 corresponds to a memory cell of the EPROM, and this transistor Q6 receives a word line selection signal X from a word line 10. A node $N_3$ corresponds to a bit line, and this node $N_3$ is coupled to a node $N_2$ which corresponds to a bus line via a transistor Q5. The transistor Q5 receives a bit line selection signal Y. Transistors Q1 and Q2 form an inverter and is used as a bias circuit for feeding back a signal at the node $N_2$ to a transistor Q4. In order to prevent soft error, the potential at the node $N_2$ is set to approximately 1 V. Driving transistors Q3 and Q8 form a current mirror circuit. A transistor Q7 acts as a load and flows a current which is approximately ½ a cell current that a transistor Q6 flows. A sensed data DATA is output from a terminal 11.

When sensing the data, the bit line selection signal Y is set to a high level to select a single bit line, and thus, a potential at the node $N_3$ is pulled up from 0 V to 1 V by the bias circuit. Thereafter, the word line selection signal X is set to a high level to select a single word line. For example, when a data is already written into the transistor Q6 (that is, the transistor Q6 is programmed), a current does not flow through the transistor Q6 and the potential at the base of the transistor is at the high level. In other words, the data $\overline{\text{DATA}}$ has the high level, and thus, a low-level data DATA is read out from the terminal 11.

According to the conventional sense circuit, a level fluctuation peculiar to a feedback circuit is generated by the bias circuit when the potential at the node $N_3$ is pulled up from 0 V to 1 V. For this reason, there is a problem in that the potential at the node $N_1$ and the potential of the data DATA fluctuate, thereby making a high-speed data read operation difficult. This problem is caused by a slow response of the inverter which is formed by the transistors Q1 and Q2 and a poor convergence of the level fluctuation of the bias circuit in a vicinity of a steady state level (1 V) of the node $N_3$.

SUMMARY OF THE INVENTION

Accordingly, it is a general object of the present invention to provide a novel and useful sense circuit in which the problem described above is eliminated.

Another and more specific object of the present invention is to provide a sense circuit for a non-volatile memory device which includes a plurality of cell transistors which form memory cells, where each cell transistor is connected to one of a plurality of word lines and to one of a plurality of bit lines and the bit lines are connected to a bus line, comprising selecting means coupled to the bus line for selecting a predetermined cell transistor by selecting a predetermined bit line which is connected to the predetermined cell transistor, a feedback type bias circuit coupled to the selecting means for maintaining a potential of the bus line to a constant level, the feedback type bias circuit including a first transistor which flows a current to the bus line, detecting means coupled to the feedback type bias circuit for detecting whether or not a current flows through the predetermined cell transistor so as to read a data from the predetermined cell transistor, the detecting means including a terminal for outputting the read data, and current source means coupled to the feed back type bias circuit and including a second transistor for forcibly supplying a predetermined current to the first transistor, so that a gate-source voltage of the first transistor is greater than a threshold voltage of the first transistor. According to the sense circuit of the present invention, it is possible to quickly converge a level fluctuation which occurs at the bus line when the predetermined bit line is selected. For this reason, it is possible to read the data from the non-volatile memory device at a high speed.

Other objects and further features of the present invention will be apparent from the following detailed description when read in conjunction with the accompanying drawings.

DESCRIPTION OF THE PREFERRED EMBODIMENTS

Figure 2:
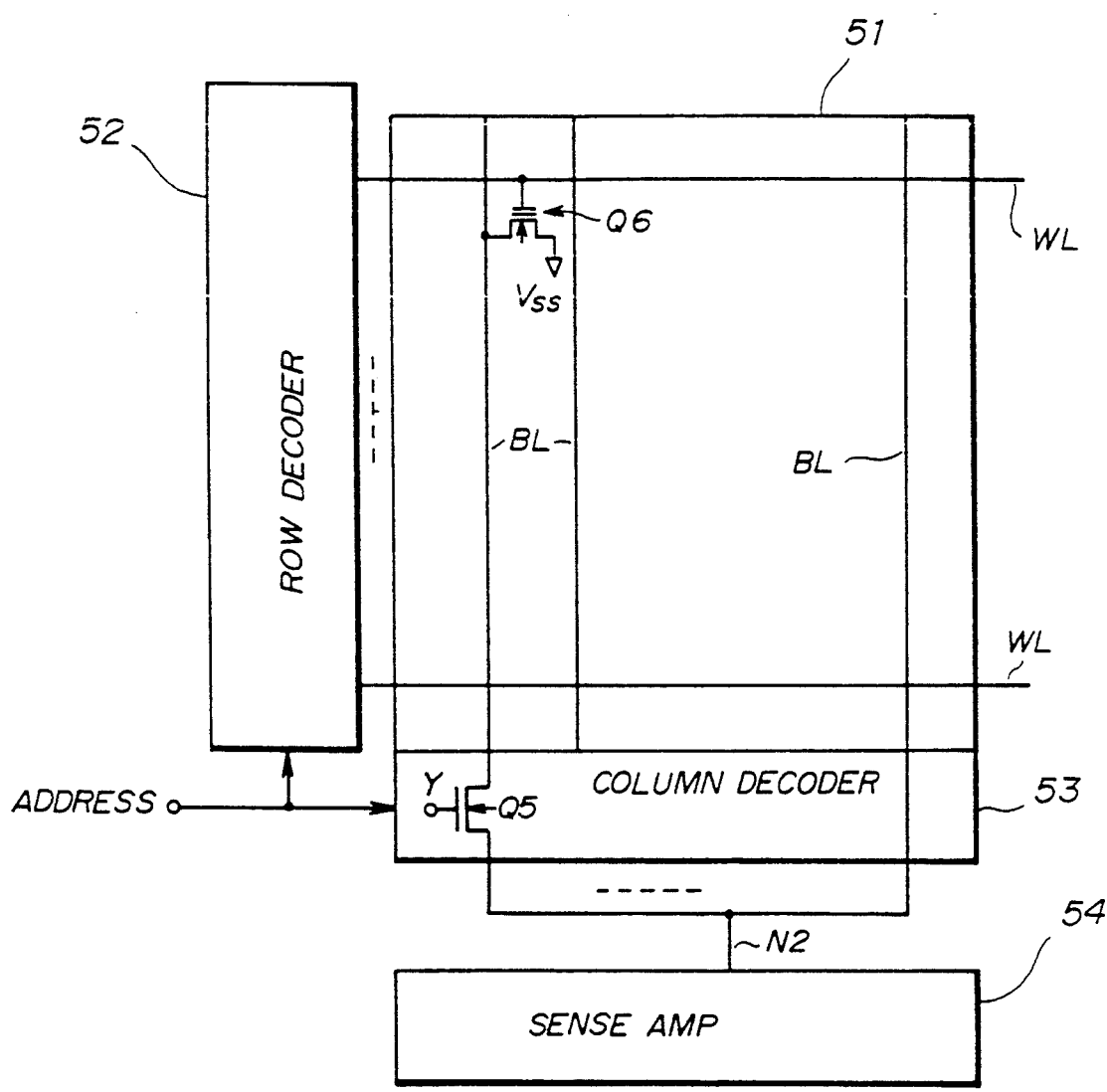
FIG. 2 is a system block diagram showing a non-volatile memory device to which a sense circuit according to the present invention may be applied.

FIG. 2 generally shows a non-volatile memory device to which a sense circuit according to the present invention may be applied. An EPROM shown in FIG. 2 includes a memory cell array 51, a row decoder 52, a column decoder 53 and a sense amplifier 54. Memory cells (Q6) are arranged in a matrix arrangement within the memory cell array 51, and each memory cell is connected to one of a plurality of word lines WL and to one of a plurality of bit lines BL. The sense circuit according to the present invention is provided within the sense amplifier 54.

Figure 1:
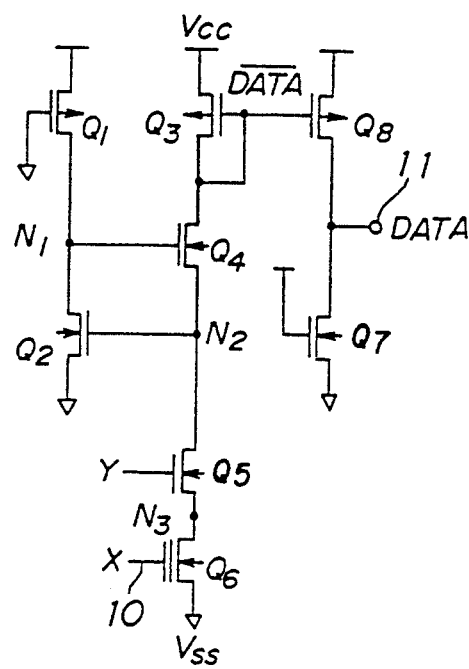
FIG. 1 is a circuit diagram showing an essential part of an example of a conventional sense circuit together with related parts of a non-volatile memory device.
Figure 3:
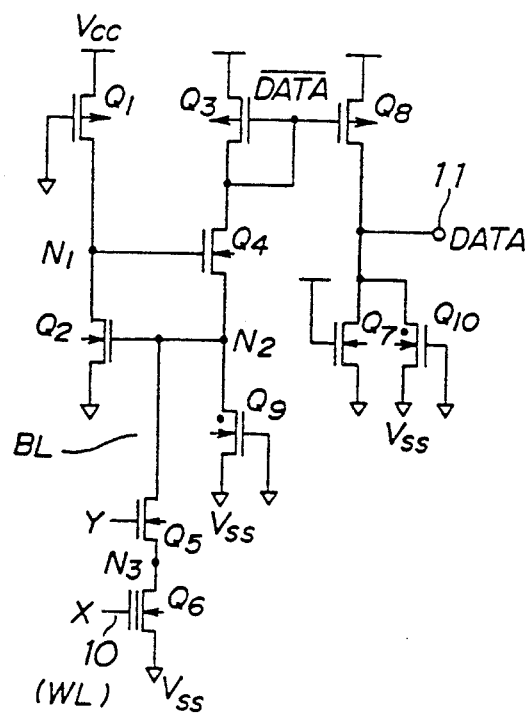
FIG. 3 is a circuit diagram showing an essential part of a first embodiment of the sense circuit according to the present invention together with related parts of the non-volatile memory device.
Figure 5:
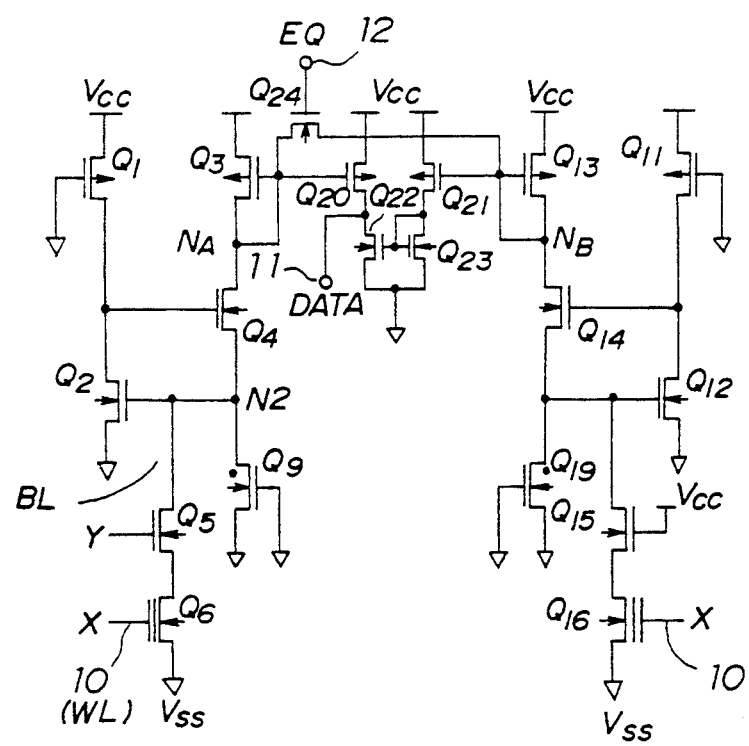
FIG. 5 is a circuit diagram showing an essential part of a second embodiment of the sense circuit according to the present invention together with related parts of the non-volatile memory device.

A description will be given of a first embodiment of a sense circuit according to the present invention, by referring to FIG. 3. In FIG. 3, those parts which are basically the same as those corresponding parts in FIG. 1 are designated by the same reference numerals, and a description thereof will be omitted. In FIG. 3 and FIG. 5 which will be described later in the specification, a depletion type MOS transistor is indicated with a dot beside its drain.

In FIG. 3, a drain of a depletion type n-channel MOS transistor Q9 is connected to the node N$_2$ which corresponds to the bus line. A gate and a source of the transistor Q9 is connected to a power source which supplies a power source voltage Vss (=0 V). A drain of a depletion type n-channel MOS transistor Q10 is connected to the terminal 11, and a gate and a source of the transistor Q10 is connected to the power source which supplies the power source voltage Vss.

Figure 4:
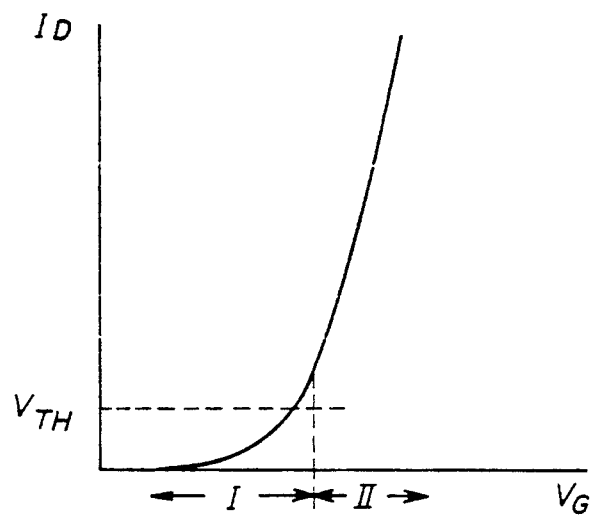
FIG. 4 shows a drain current versus gate voltage characteristic of a transistor in the sense circuit shown in FIG. 3.

The transistor Q9 is used as a current source. The transistor Q9 constantly supplies a current to lower the source potential of the transistor Q4 except in a standby mode in which the current consumption is reduced. Accordingly, a gate-source voltage of the transistor Q4 is biased to become greater than a threshold voltage V$_{TH}$ of the transistor Q4, and the transistor Q4 is used in a region II shown in FIG. 4 which shows a drain current I$_D$ versus gate voltage V$_G$ characteristic of the transistor Q4. In the region II, a change $\Delta I_D/V_G$ in I$_D$/V$_G$ is sufficiently large and the drain current I$_D$ is linear with respect to the gate voltage V$_G$. For this reason, when the cell current supplied by the transistor Q6 is 60 $\mu$A, for example, the bias current supplied by the transistor Q9 is set to a large value of 30 to 60 $\mu$A which is approximately the same as the cell current.

In this case, the cell current supplied by the transistor Q8 and the bias current supplied by the transistor Q9 flow to the transistor Q8. Hence, a transistor Q10 is provided to cancel the bias current, and this transistor Q10 supplies a cancelling current equal to the bias current supplied by the transistor Q8.

Because the transistor Q4 is biased and activated by the transistor Q9, a current change in the transistor Q4 becomes greater than that obtainable in the conventional sense circuit even when a small change occurs in the gate voltage of the transistor Q4. Hence, the level fluctuation which occurs when the bit line BL is selected and the potential at the node N$_3$ is pulled up from 0 V to 1 V converges quickly, thereby making it possible to carry out a high-speed data read operation.

Next, a description will be given of a second embodiment of the sense circuit according to the present invention, by referring to FIG. 5. In FIG. 5, those parts which are the same as those corresponding parts in FIG. 3 are designated by the same reference numerals, and a description thereof will be omitted.

In FIG. 5, transistors Q11 through Q19 form a reference circuit having a circuit construction identical to the circuit formed by the transistors Q1 through Q9. No data is written into the transistor Q16 which is used as a dummy memory cell, that is, the transistor Q16 is not programmed. In addition, the transistor Q15 is always ON. A node N$_A$ at the gate of the transistor Q3 is connected to a gate of a transistor Q20, and a node N$_B$ at a gate of the transistor Q13 is connected to a gate of a transistor Q21. The transistors Q20 and Q21 form a differential circuit together with transistors Q22 and Q23 which form a current mirror circuit. Further, drain and source of a transistor Q24 are respectively connected to the nodes N$_A$ and N$_B$.

The current value of the transistor Q13 is set to two times the current value of the transistor Q3 in order to set the potential at the node N$_B$ to approximately ½ that at the node N$_A$ when no data is written into the transistor Q6. In addition, the current value of the transistor Q19 is set to two times the current value of the transistor Q9.

In this embodiment, a high-level equalizing signal EQ is supplied to a terminal 12 prior to the data sensing so as to turn the transistor Q24 ON and set the potentials at the nodes N$_A$ and N$_B$ to the same level. Thereafter, when the transistor Q24 is cut OFF and the bit line selection and the word line selection are made, the potential at the node N$_A$ becomes higher than that at the node N$_B$ when the data is written into the transistor Q6, and the differential circuit reads a low-level data DATA from the terminal 11 at a high speed.

Therefore, the transistors Q9 and Q19 which are used as current sources respectively activate the transistors Q4 and Q14, and the high-speed data read operation is realized by the improved convergence of the level fluctuation, similarly as in the case of the first embodiment.

Further, the present invention is not limited to these embodiments, but various variations and modifications may be made without departing from the scope of the present invention.

What is claimed is:

1. A sense circuit for a non-volatile memory device which includes a plurality of cell transistors which form memory cells, each cell transistor being connected to one of a plurality of word lines and to one of a plurality of bit lines, said bit lines being connected to a bus line, said sense circuit comprising:

selecting means coupled to the bus line for selecting a predetermined cell transistor by selecting a predetermined bit line which is connected to the predetermined cell transistor;

a feedback type bias circuit coupled to said selecting means for maintaining a potential of the bus line to a constant level, said feedback type bias circuit including a first transistor which flows a current to the bus line;

detecting means coupled to said feedback type bias circuit for detecting whether or not a current flows through the predetermined cell transistor so as to read a data from the predetermined cell transistor, said detecting means including a terminal for outputting the read data; and current source means coupled to said feedback type bias circuit, said current source means including a second transistor for forcibly supplying a predetermined current to said first transistor, so that a gate-source voltage of said first transistor is greater than a threshold voltage of said first transistor and wherein said second transistor for supplying a bias current maintains the conductance of said first transistor in a linear conducting region of its conductance characteristic.

2. The sense circuit as claimed in claim 1, wherein said current source means constantly supplies the predetermined current except for a standby mode in which a current consumption of the non-volatile memory device is minimized.

3. The sense circuit as claimed in claim 1, wherein said current source means supplies the predetermined current to said first transistor, so that said first transistor operates in an operating region in which a change in I$_D$/V$_G$ is greater than a predetermined value, where I$_D$ denotes a drain current of said first transistor and V$_G$ denotes a gate voltage of said first transistor.

4. The sense circuit as claimed in claim 1, wherein said second transistor is a depletion type MOS transistor.

5. The sense circuit as claimed in claim 1, wherein said predetermined current is approximately the same as a cell current which flows through said predetermined cell transistor.

6. The sense circuit as claimed in claim 1, wherein said detecting means receives a cell current from the predetermined cell transistor and said bias current from said second transistor, and said detecting means includes a third transistor coupled to said terminal for cancelling said bias current.

7. The sense circuit as claimed in claim 6, wherein said third transistor is a depletion type MOS transistor.

8. The sense circuit as claimed in claim 1, which further comprises a reference circuit which has a circuit construction identical to a circuit formed by said selecting means, said feedback type bias circuit, said detecting means and said current source means, and a differential circuit which is coupled to said reference circuit for outputting the read data to said terminal, said reference circuit having a dummy cell transistor which corresponds to the cell transistor.

9. The sense circuit as claimed in claim 8, wherein a part of said reference circuit corresponding to said selecting means constantly selects a line corresponding to the predetermined bit line, and said dummy cell transistor stores no data.

10. The sense circuit as claimed in claim 1, wherein the non-volatile memory device includes a row decoder coupled to the word lines for selecting one of the word lines, a column decoder coupled to the bit lines for selecting one of the bit lines, and a sense amplifier coupled to the column decoder for sensing and amplifying the data read out from the predetermined cell transistor, said sense circuit being provided within said sense amplifier.

* * * * *